United States Patent
Kariya et al.

(10) Patent No.: US 6,642,812 B2
(45) Date of Patent: Nov. 4, 2003

(54) HIGH FREQUENCY CIRCUIT COMPONENT

(75) Inventors: Toshiaki Kariya, Sabae (JP); Mitsuhide Kato, Sabae (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/232,677

(22) Filed: Sep. 3, 2002

(65) Prior Publication Data
US 2003/0052748 A1 Mar. 20, 2003

(30) Foreign Application Priority Data
Sep. 14, 2001 (JP) .................. 2001-279740

(51) Int. Cl.[7] .................. H03H 7/00; H03H 7/01
(52) U.S. Cl. .................. 333/185; 333/175
(58) Field of Search .................. 333/185, 134, 333/175, 184, 204, 219

(56) References Cited

U.S. PATENT DOCUMENTS

| | | | | |
|---|---|---|---|---|
| 4,999,595 A | * | 3/1991 | Azumi et al. | 333/184 |
| 5,610,565 A | * | 3/1997 | Maeda et al. | 333/185 |
| 6,433,653 B1 | * | 8/2002 | Matsumura et al. | 333/185 |
| 6,504,452 B2 | * | 1/2003 | Takada et al. | 333/185 |

FOREIGN PATENT DOCUMENTS

| | | |
|---|---|---|
| EP | 1 083 620 A2 | 3/2001 |
| EP | 1 083 621 A2 | 3/2001 |
| JP | 07-106898 | 4/1995 |
| JP | 11-317311 | 11/1999 |
| JP | 2000-077911 | 3/2000 |
| JP | 2000-295007 | 10/2000 |

* cited by examiner

*Primary Examiner*—Patrick Wamsley
(74) *Attorney, Agent, or Firm*—Keating & Bennett, LLP

(57) ABSTRACT

A small high frequency circuit component has very small variations in stray capacitance generated between an inductor electrode pattern and a capacitor electrode pattern. As a result, the variations in the characteristics thereof are also small. The inductor electrode pattern is overlaid with the capacitor electrode pattern in a plan view. That is, when viewed from the lamination direction, the projection of the inductor electrode pattern onto the capacitor electrode pattern is included within the capacitor electrode pattern. More particularly, outer dimensions W1, L1, D1 of the inductor electrode pattern and corresponding outer dimensions W2, L2, D2 of the capacitor electrode pattern satisfy the following conditions, respectively:

$W2 = W1 + \Delta$, where $0.1 \text{ mm} \leq \Delta \leq 1.0 \text{ mm}$, $L2 = L1 + \Delta$, where $0.1 \text{ mm} \leq \Delta \leq 1.0 \text{ mm}$, and $D2 = D1 + \Delta$, where $0.1 \text{ mm} \leq \Delta \leq 1.0 \text{ mm}$.

18 Claims, 6 Drawing Sheets

HIGH FREQUENCY CIRCUIT COMPONENT

BACKGROUND OF THE INVENTION

1. Field of the Invention

The present invention relates to high frequency circuit components, and more particularly, the present invention relates to a high frequency circuit component having an inductor and a capacitor in a laminate member which is formed by laminating a plurality of insulating layers.

2. Description of the Related Art

A known high frequency circuit component is a high frequency filter having a laminate member which is formed by laminating at least one insulating sheet having an inductor electrode pattern provided on the surface thereof, for forming an inductor, at least one pair of insulating sheets having capacitor electrode patterns provided on the surface thereof, for forming a capacitor, at least one insulating sheet having another conductive pattern on the surface thereof, and so forth. In the laminate member, a predetermined high frequency filter circuit is configured by electrically connecting the inductor including the inductor electrode pattern and the capacitor including the capacitor electrode patterns.

In the known high frequency filter, while the insulating sheets are laminated, the inductor electrode pattern defining the inductor is sometimes displaced relative to the capacitor electrode pattern defining the capacitor in a direction which is perpendicular to the lamination direction. In this case, variations in stray capacitance generated between the inductor electrode pattern and the capacitor electrode pattern occur, thereby causing the variations in the impedance of the inductor to take place.

When the inductor electrode pattern is used as an element of an inductor for an LC resonator or a λ/4 resonator, the variations in impedance which occur due to the relative displacement of the insulating sheets as mentioned above cause its resonance frequency to vary. As a result, the desired characteristics of the high frequency filter are not obtained, and thus, product yield is reduced.

To solve these problems, it is necessary to make the distance between the inductor electrode pattern and the capacitor electrode pattern longer, or to arrange the inductor electrode pattern and the capacitor electrode pattern so as not to be overlaid with each other. However, these countermeasures increase the size of the laminate member, and accordingly, cause an increase in the size of the high frequency filter.

SUMMARY OF THE INVENTION

In order to overcome the problems described above, preferred embodiments of the present invention provide a very small high frequency circuit component in which the variations in stray capacitance which occur between an inductor electrode pattern and a capacitor electrode pattern are minimized and accordingly, the variations in the characteristics of the high frequency circuit component are minimized.

A high frequency circuit component according to a preferred embodiment of the present invention includes a laminate member including at least one pair of capacitor electrode patterns for defining a capacitor, at least one inductor electrode pattern for defining an inductor, and at least one pair of insulating layers disposed between the capacitor electrode patterns and the inductor electrode pattern. The laminate member is constructed by laminating at least the capacitor electrode patterns, the inductor electrode pattern, and the insulating layers. Also, when viewed from the lamination direction of the laminate member, the projections of the inductor electrode pattern onto the capacitor electrode patterns are included within the capacitor electrode patterns. In other words, when viewed from the lamination direction of the laminate member, the outer periphery of the inductor electrode pattern is within the outer periphery of the capacitor electrode patterns. Furthermore, the distances between the capacitor electrode patterns and the inductor electrode pattern preferably range from about 0.025 mm to about 1 mm. Moreover, an outer length A of the capacitor electrode patterns and a corresponding outer length B of the inductor electrode pattern preferably satisfy the following condition I:

$$A = B + \Delta, \text{ where } 0.1 \text{ mm} \leq \Delta \leq 1.0 \text{ mm} \tag{I}.$$

With the above-described construction, even when the inductor electrode pattern and the corresponding capacitor electrode patterns are relatively displaced in a direction that is substantially perpendicular to the lamination direction during the process of laminating the insulating sheets, the opposing areas between the inductor electrode pattern and the capacitor electrode patterns do not vary, and thus, stray capacitances present in the space between the inductor electrode pattern and the capacitor electrode patterns always remain constant as long as the projections of the inductor electrode pattern onto the capacitor electrode patterns are included within the capacitor electrode patterns. Consequently, the variances in impedance of the inductor are reliably minimized and greatly reduced, and thus, the variations in the circuit characteristics due to the variations in displacement occurring during laminating the insulating sheets are minimized and greatly reduced, whereby a high-yield, high-frequency low-pass filter is provided.

In addition, according to a preferred embodiment of the present invention, the distances between the inductor electrode pattern and the corresponding capacitor electrode patterns are very short, and also the inductor electrode pattern and the capacitor electrode patterns are limitless in forming layout patterns including a spiral shape, a serpentine shape, and a combination of these shapes. As a result, the size of the high frequency low-pass filter is greatly reduced.

Other features, elements, characteristics and advantages of the present invention will become more apparent from the following detailed description of preferred embodiments thereof with reference to the attached drawings.

DETAILED DESCRIPTION OF PREFERRED EMBODIMENTS

High frequency circuit components according to preferred embodiments of the present invention will be described in accordance with the accompanying drawings.

Referring now to FIGS. 1 to 4, a high frequency low-pass filter according to a first preferred embodiment will be described.

Figure 1:
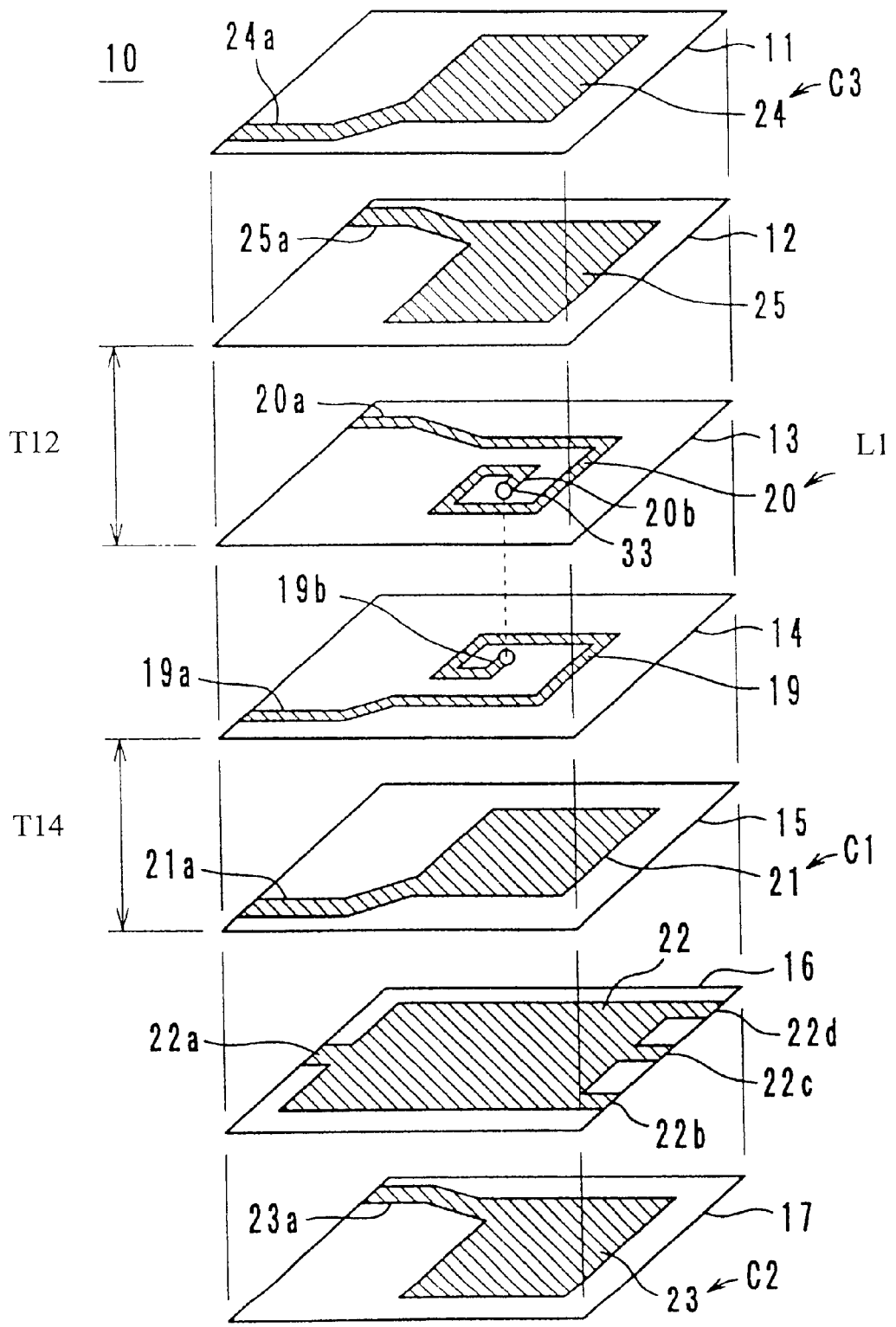
FIG. 1 is an exploded perspective view of a high frequency circuit component according to a first preferred embodiment of the present invention.
Figure 2:
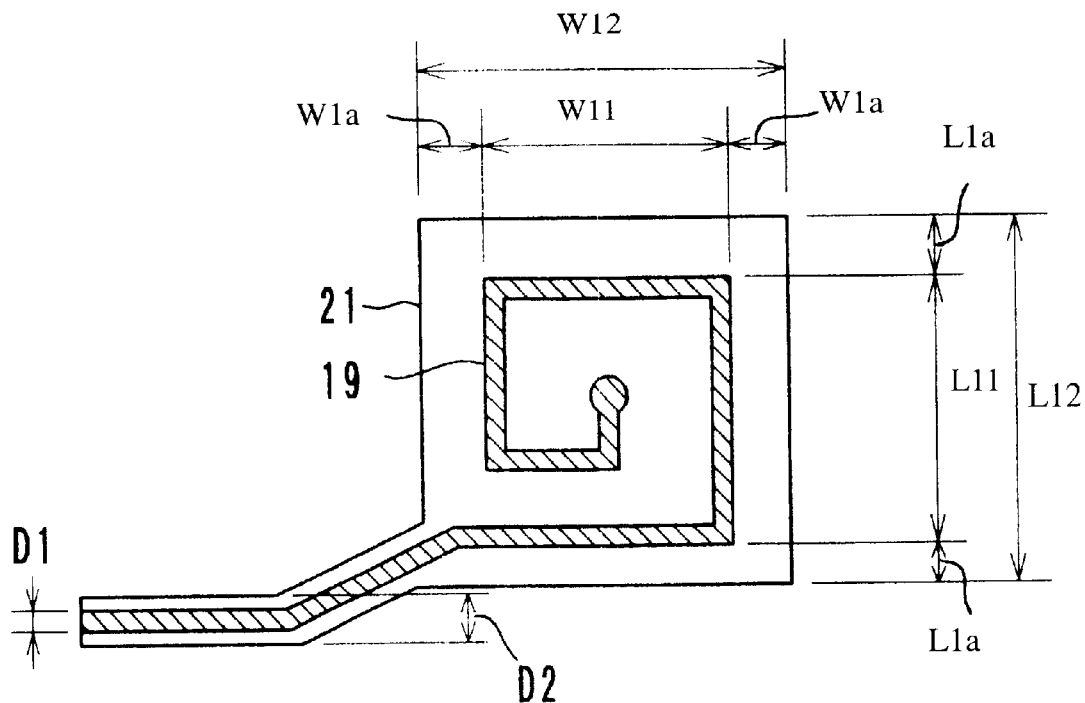
FIG. 2 is an illustration of the inclusion relationship between an inductor electrode pattern and a capacitor electrode pattern in the high frequency circuit component shown in FIG. 1.
Figure 3:
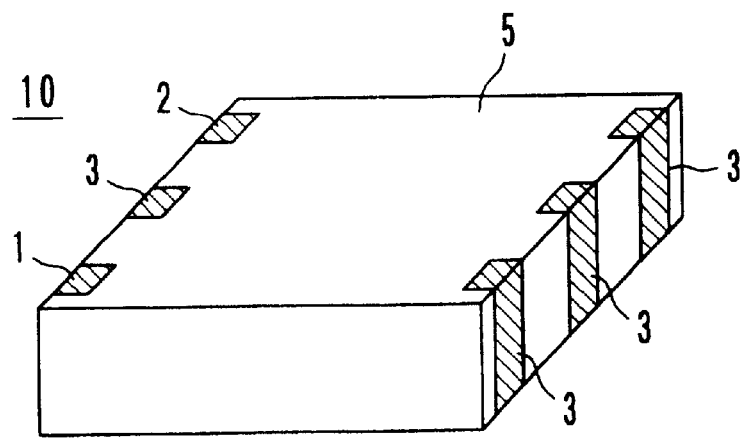
FIG. 3 is an external perspective view of the high frequency circuit component shown in FIG. 1.

As shown in FIGS. 1 to 3, a high frequency low-pass filter 10 according to the first preferred embodiment is constructed by laminating insulating sheets 14 and 13 having inductor electrode patterns 19 and 20 disposed on respective surfaces thereof, insulating sheets 15, 16, 17, 11, and 12 having capacitor electrode patterns 21 to 25 on respective surfaces thereof, and so forth.

Although the insulating sheets 11 to 17 are preferably made of dielectric ceramic green sheets in this preferred embodiment, these sheets may be made of a resin such as an epoxy resin, a magnetic ceramic or other suitable material. Each of the insulating sheets 11 to 17 has a predetermined thickness.

The inductor electrode pattern 19 has a spiral shape and one end exposed at the front portion of the left side of the insulating sheet 14 so as to define a lead electrode pattern 19a for connecting the inductor electrode pattern 19 to an external electrode 1. The inductor electrode pattern 20 also has a spiral shape and one end exposed at the rear portion of the left side of the insulating sheet 13 so as to define a lead electrode pattern 20a for connecting the inductor electrode pattern 20 to an external electrode 2.

The inductor electrode pattern 20 has the other end 20b disposed inside the spiral shape. The other end 20b is electrically connected to the other end 19b disposed inside of the spiral shape of the inductor electrode pattern 19 through a via-hole 33 formed in the insulating sheet 13. With this arrangement, the inductor electrode patterns 19 and 20 are electrically connected in series to each other so as to define an inductor L1.

The capacitor electrode pattern 21 faces the grounding capacitor electrode pattern 22 having the insulating sheet 15 interposed therebetween so as to define a capacitor C1. The capacitor electrode pattern 21 has one end exposed at the front portion of the left side of the insulating sheet 15 so as to define a lead electrode pattern 21a for connecting the capacitor electrode pattern 21 to the external electrode 1. The grounding capacitor electrode pattern 22 has one end 22a exposed at the approximately central portion of the left side of the insulating sheet 16, and the other ends 22b, 22c, and 22d exposed at the front, approximately central, and rear portions, respectively, of the right side of the insulating sheet 16.

The capacitor electrode pattern 23 faces the grounding capacitor electrode pattern 22 having the insulating sheet 16 interposed therebetween so as to define a capacitor C2. The capacitor electrode pattern 23 has one end 23a exposed at the rear portion of the left side of the insulating sheet 17. The capacitor electrode pattern 24 faces the capacitor electrode pattern 25 having the insulating sheet 11 interposed therebetween so as to define a capacitor C3. The capacitor electrode pattern 24 has one end 24a exposed at the front portion of the left side of the insulating sheet 11. The capacitor electrode pattern 25 has one end exposed at the rear portion of the left side of the insulating sheet 12 so as to define a lead electrode pattern 25a for connecting the capacitor electrode pattern 25 to the external electrode 2.

The inductor electrode patterns 19 and 20 are located next to the capacitor electrode patterns 21 and 25 having the insulating sheets 14 and 12 interposed therebetween and are overlaid with the capacitor electrode patterns 21 and 25, respectively, in a plan view.

More particularly, when viewed from the lamination direction of the insulating sheets 11 to 17, the projection of the inductor electrode pattern 19 onto the capacitor electrode pattern 21 is included within the capacitor electrode pattern 21, and an outer length A1 of the capacitor electrode pattern 21 and a corresponding outer length B1 of the inductor electrode pattern 19 preferably satisfy the following condition I:

$$A1=B1+\Delta, \text{ where } 0.1 \text{ mm} \leq \Delta \leq 1.0 \text{ mm} \tag{I}$$

Also, when viewed from the lamination direction of the insulating sheets 11 to 17, the projection of the lead electrode pattern 19a onto the lead electrode pattern 21a is included within the lead electrode pattern 21a, and a line width D2 of the lead electrode pattern 21a and a line width D1 of the lead electrode pattern 19a preferably satisfy the following condition II:

$$D2=D1+\Delta, \text{ where } 0.1 \text{ mm} \leq \Delta \leq 1.0 \text{ mm} \tag{II}.$$

More particularly, outer lateral and longitudinal lengths W11 and L11 of the inductor electrode pattern 19, and the line width D1 of the lead electrode 19a and outer lateral and longitudinal lengths W12 and L12 of the capacitor electrode pattern 21, and the line width D2 of the lead electrode 21a preferably satisfy the following conditions, respectively, as these reference marks are shown in FIG. 2:

$$W12=W11+\Delta, \text{ where } 0.1 \text{ mm} \leq \Delta \leq 1.0 \text{ mm}$$

$$L12=L11+\Delta, \text{ where } 0.1 \text{ mm} \leq \Delta \leq 1.0 \text{ mm, and}$$

$$D2=D1+\Delta, \text{ where } 0.1 \text{ mm} \leq \Delta \leq 1.0 \text{ mm}.$$

Furthermore, considering that the variations in displacement occurring during laminating of the insulating sheets 11 to 17 are preferably in the range from about 0.05 mm to about 0.5 mm, the inductor electrode pattern 19 is positioned between the left and right edge regions W1a and between the upper and lower edge regions L1a of the capacitor electrode pattern 21, wherein W1a and L1a preferably range from about 0.05 mm to about 0.5 mm.

In this preferred embodiment, since the distances between the inductor electrode patterns 19 and 20 and the corresponding capacitor electrode patterns 21 and 25 can be made shorter, the foregoing setting is more effective when thicknesses T12 and T14 of the corresponding insulating sheets 12 and 14 are small, i.e., when ranging from about 0.025 mm to about 0.15 mm. Each of the insulating sheets 11 to 17 is preferably made of a single sheet having a thickness of, for example, approximately 0.01 mm, 0.025 mm, 0.05 mm, 0.1 mm, 0.15 mm, or 0.2 mm, or of a plurality of sheets having the same thickness or different thicknesses from each other.

Likewise, the inductor electrode pattern 20 is also overlaid with the capacitor electrode pattern 25 in a plan view. In other words, the projection of the inductor electrode pattern 20 onto the capacitor electrode pattern 25 is included within the capacitor electrode pattern 25, and the relationships between these two patterns are similar to the above-described relationships between the inductor electrode pattern 19 and the capacitor electrode pattern 21.

Also, the thickness T14 of the fired insulating sheet 14 defining the distance between the inductor electrode pattern 19 and the capacitor electrode pattern 21 and also the thickness T12 of the fired insulating sheet 12 defining the distance between the inductor electrode pattern 20 and the capacitor electrode pattern 25 are preferably within the range from about 0.025 to about 1 mm.

The inductor electrode patterns 19 and 20 and the capacitor electrode patterns 21 to 25 are preferably made of a conductive material such as Ag—Pd, Ag, Pd, Cu, Ni, or Au, and are preferably formed by sputtering, evaporation, screen printing, photolithography or other suitable process.

The laminated insulating sheets 11 to 17 preferably have insulating protection sheets disposed on the top and the bottom thereof, and then are integrally fired so as to form a substantially rectangular laminate member 5 as shown in FIG. 3. The laminate member 5 has external electrodes 1 to 3 disposed on the right and left side surfaces thereof. These external electrodes 1 to 3 are preferably made of a conductive material such as Ag—Pd, Ag, Pd, Cu, or a copper alloy, and are preferably formed by sputtering, evaporation, coating (dipping), printing, or other suitable process.

Figure 4:
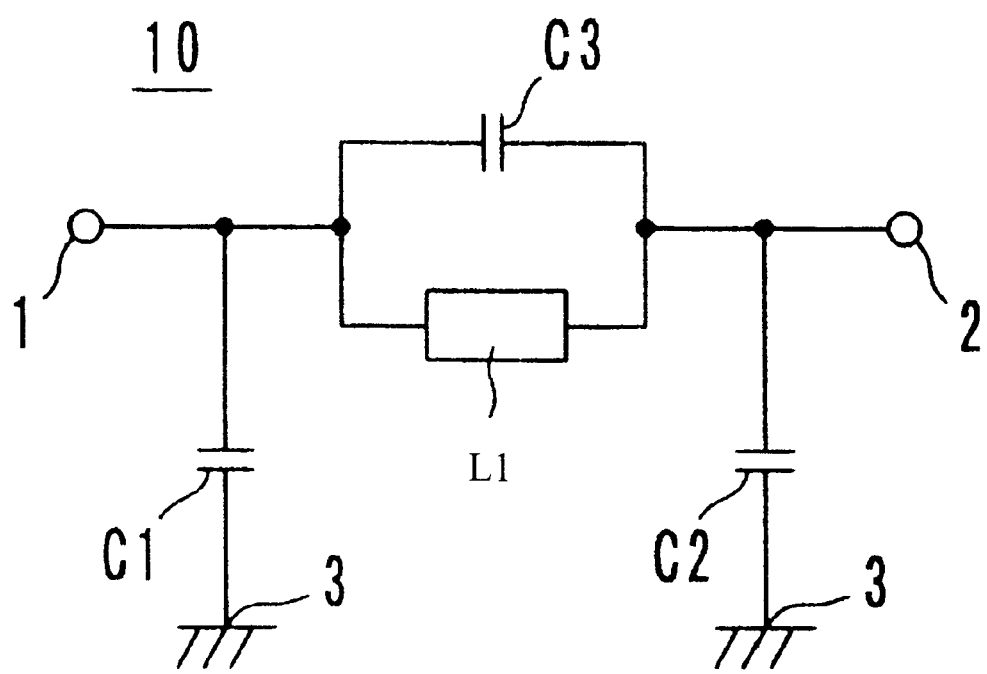
FIG. 4 is an electrical equivalent circuit diagram of the high frequency circuit component shown in FIG. 3.

The external electrode 1 disposed on the left side surface of the laminate member 5 is electrically connected to the inductor electrode pattern 19 and the capacitor electrode patterns 21 and 24 and functions as an input external electrode. The external electrode 2 is electrically connected to the inductor electrode pattern 20 and the capacitor electrode patterns 23 and 25 and functions as an output external electrode. The external electrodes 3 are electrically connected to the grounding capacitor electrode pattern 22 and functions as grounding external electrodes. FIG. 4 illustrates an electrical equivalent circuit diagram of the high frequency low-pass filter 10.

With the above-described structure, the high frequency low-pass filter 10 has an LC resonator including the above-described inductor electrode patterns and capacitor electrode patterns.

As shown in FIG. 2, when viewed from the lamination direction of the insulating sheets 11 to 17, the projections of the inductor electrode patterns 19 and 20 onto the capacitor electrode patterns 21 and 25 are included within the capacitor electrode patterns 21 and 25, respectively. Accordingly, even when the inductor electrode patterns 19 and 20 and the corresponding capacitor electrode patterns 21 and 25 are relatively displaced in a direction that is substantially perpendicular to the lamination direction during the process of laminating the insulating sheets 11 to 17, two opposing areas between the inductor electrode pattern 19 and the capacitor electrode pattern 21 and between the inductor electrode pattern 20 and the capacitor electrode pattern 25 do not vary, and thus stray capacitances which occur in the spaces between the inductor electrode pattern 19 and the capacitor electrode pattern 21 and between the inductor electrode pattern 20 and the capacitor electrode pattern 25 always remain constant as long as the above-described inclusion relationships between the inductor electrode patterns 19 and 20 and the corresponding capacitor electrode pattern 21 and 25 are maintained.

Consequently, the variances in impedance of the inductor L1 due to the variations in displacement occurring during laminating of the insulating sheets 11 to 17 are minimized and greatly reduced, and thus the variations in the filter characteristics are minimized and greatly reduced, whereby a high-yield, high-frequency low-pass filter 10 is provided. In addition, both distances between the inductor electrode pattern 19 and the capacitor electrode pattern 21 and between the inductor electrode pattern 20 and the capacitor electrode pattern 25 are very short, and also the inductor electrode patterns 19 and 20 and the capacitor electrode patterns 21 and 25 are limitless in forming layout patterns. As a result, the size of the high frequency low-pass filter 10 is greatly reduced.

Figure 5:
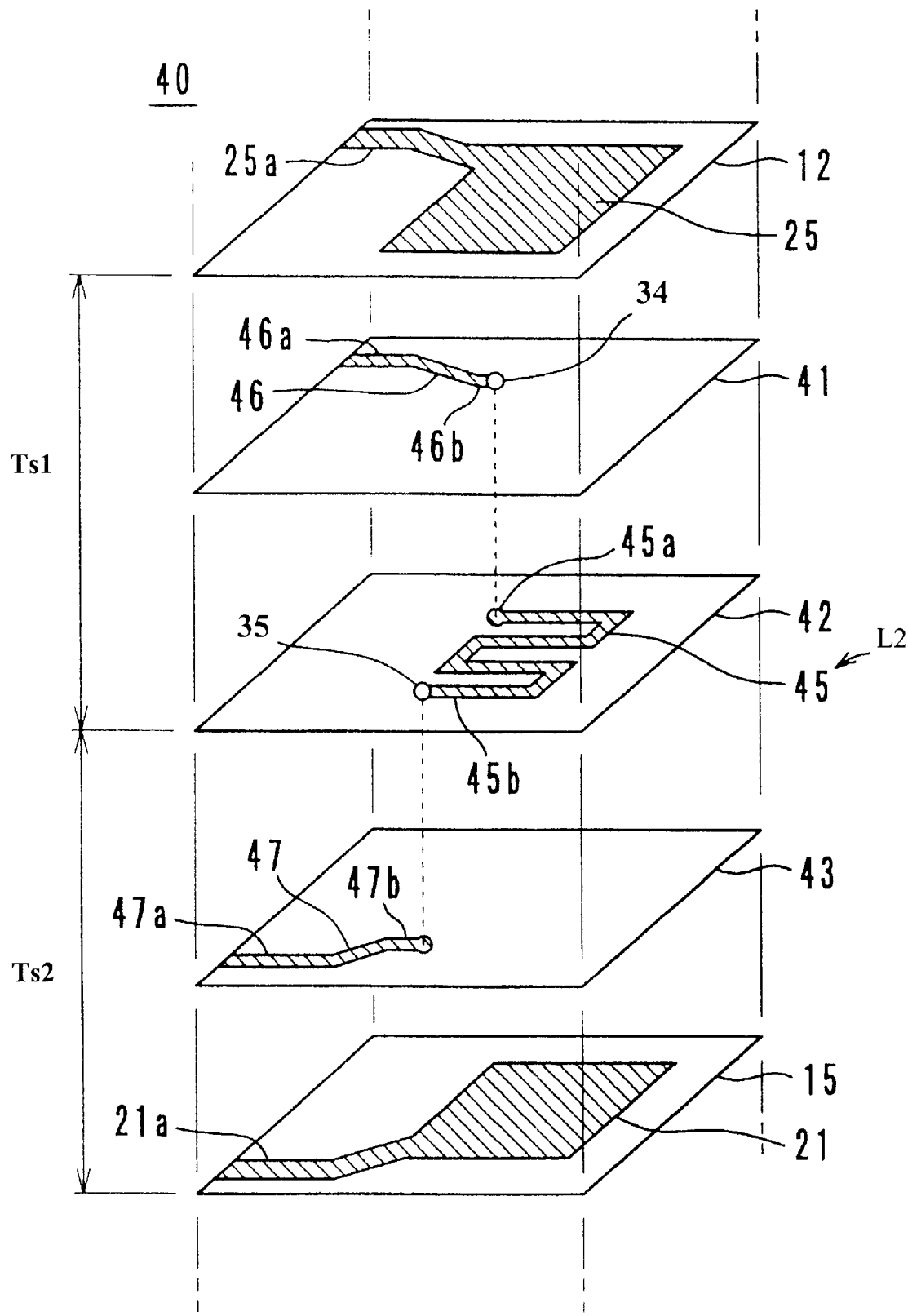
FIG. 5 is an exploded perspective view of a high frequency circuit component according to a second preferred embodiment of the present invention.
Figure 6:
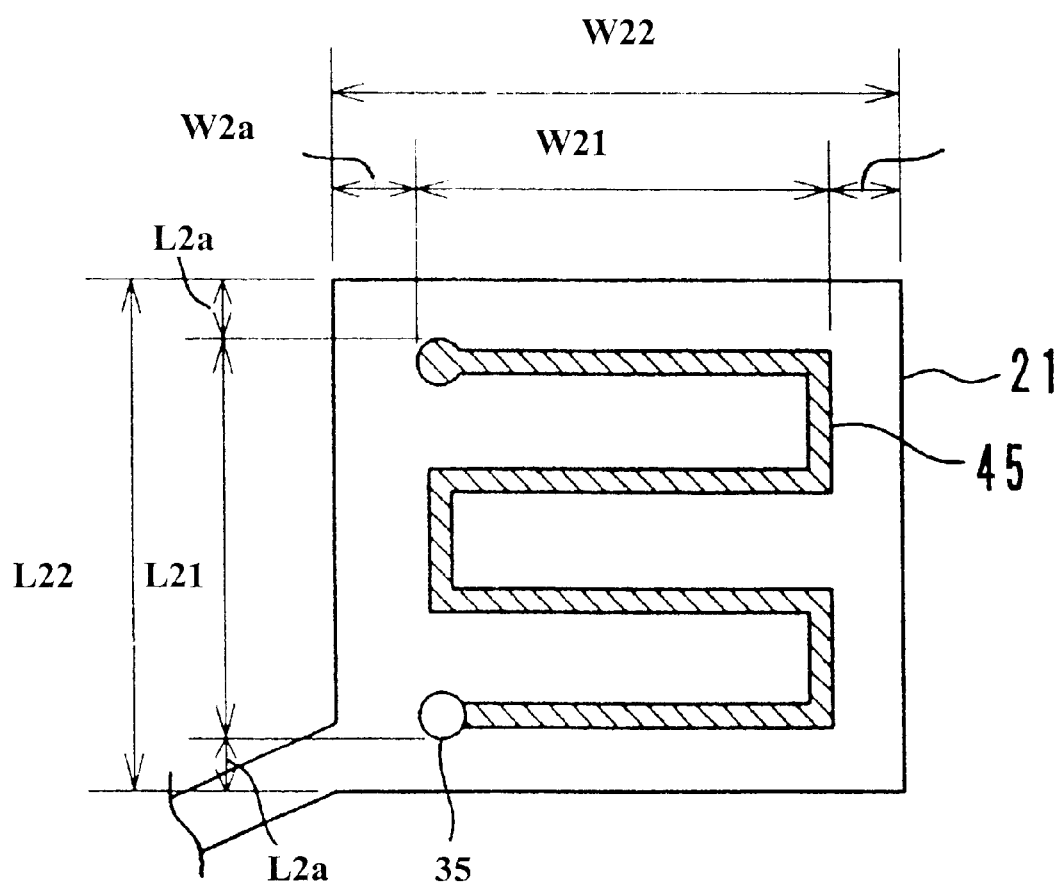
FIG. 6 is an illustration of the inclusion relationship between an inductor electrode pattern and a capacitor electrode pattern in the high frequency circuit component shown in FIG. 5.

Referring now to FIGS. 5 and 6, a high frequency low-pass filter according to a second preferred embodiment will be described.

As shown in FIG. 5, a high frequency low-pass filter 40 according to the second preferred embodiment preferably has substantially the same structure as the first frequency low-pass filter 10 of the first preferred embodiment except that an insulating sheet 42 having a serpentine inductor electrode pattern 45 disposed on the surface thereof, and insulating sheets 41 and 43 having lead electrode patterns 46 and 47, respectively, disposed on the surfaces thereof are provided in place of the insulating sheets 13 and 14 having the spiral inductor electrode patterns 20 and 19, respectively.

The inductor electrode pattern 45 defines an inductor L2 by itself. The inductor electrode pattern 45 has one end 45$a$ which is electrically connected to one end 46$b$ of the lead electrode pattern 46 through a via-hole 34 formed in the insulating sheet 41 and has the other end 45$b$ which is electrically connected to one end 47$b$ of the lead electrode pattern 47 through a via-hole 35 formed in the insulating sheet 42.

The lead electrode pattern 46 has the other end 46$a$ exposed at the rear portion of the left side of the insulating sheet 41. The lead electrode pattern 47 has the other end 47$a$ exposed at the front portion of the left side of the insulating sheet 43. The lead electrode patterns 46 and 47 are arranged so as not to overlap the inductor electrode pattern 45 in a plan view except at the first ends 46$b$ and 47$b$. On the contrary, the lead electrode patterns 46 and 47 are arranged so as to be overlaid with the lead portions of the capacitor electrode patterns 25 and 21, respectively, in a plan view.

The inductor electrode pattern 45 is overlaid with both of the capacitor electrode patterns 21 and 25 in a plan view. In other words, as shown in FIG. 6, when viewed from the lamination direction of the insulating sheets 41 to 43 and so forth, the projections of the inductor electrode pattern 45 onto the capacitor electrode patterns 21 and 25 are included within the capacitor electrode patterns 21 and 25. More particularly, when viewed from the lamination direction of the insulating sheets, the projection of the inductor electrode pattern 45 onto the capacitor electrode pattern 21 is included within the capacitor electrode pattern 21, and an outer length A2 of the capacitor electrode pattern 21 and a corresponding outer length B2 of the inductor electrode pattern 45 preferably satisfy the following condition I:

$$A2=B2+\Delta, \text{ where } 0.1 \text{ mm} \leq \Delta \leq 1.0 \text{ mm} \qquad (I).$$

Still more particularly, an outer lateral length W21 and an outer longitudinal length L21 of the inductor electrode pattern 45 and an outer lateral length W22 and an outer longitudinal length L22 of the capacitor electrode patterns 21 and 25 preferably satisfy the following conditions, respectively, as these reference marks are shown in FIG. 6:

$$W22=W21+\Delta, \text{ where } 0.1 \text{ mm} \leq \Delta \leq 1.0 \text{ mm, and}$$

$$L22=L21+\Delta, \text{ where } 0.1 \text{ mm} \leq \Delta \leq 1.0 \text{ mm.}$$

Furthermore, considering that the variations in displacement occurring during laminating of the insulating sheets 41 to 43 and so forth are preferably in the range from about 0.05 mm to about 0.5 mm, the inductor electrode pattern 45 is preferably located between the left and right edge regions W2a and between the upper and lower edge regions L2a of capacitor electrode patterns 21 and 25, wherein W2a and L2a preferably range from about 0.05 to about 0.5 mm.

In addition, the total thickness Ts2 of the fired insulating sheets 42 and 43 defining the distance between the inductor electrode pattern 45 and the capacitor electrode pattern 21, and also the total thickness Ts1 of the fired insulating sheets 12 and 41 defining the distance between the inductor electrode pattern 45 and the capacitor electrode pattern 25 are preferably in the range from about 0.025 mm to about 1 mm.

The high frequency low-pass filter 40 having the above-described configuration achieves the same effects and advantages as the high frequency low-pass filter 10 according to the first preferred embodiment. Although the high frequency low-pass filter 40 has the lead electrode patterns 47 and 46 disposed between the inductor electrode pattern 45 and the capacitor electrode pattern 21 and between the inductor electrode pattern 45 and the capacitor electrode pattern 25 in the lamination direction, respectively, additional capacitor electrode patterns may be provided if required, other than the lead electrode patterns 46 and 47, on the surfaces of the insulating sheets 41 and 43. These capacitor electrode patterns are disposed so as not to overlap the inductor electrode pattern 45 in a plan view.

The present invention is not limited to the foregoing preferred embodiments and can be modified in various ways within the scope of the present invention.

Figure 7:
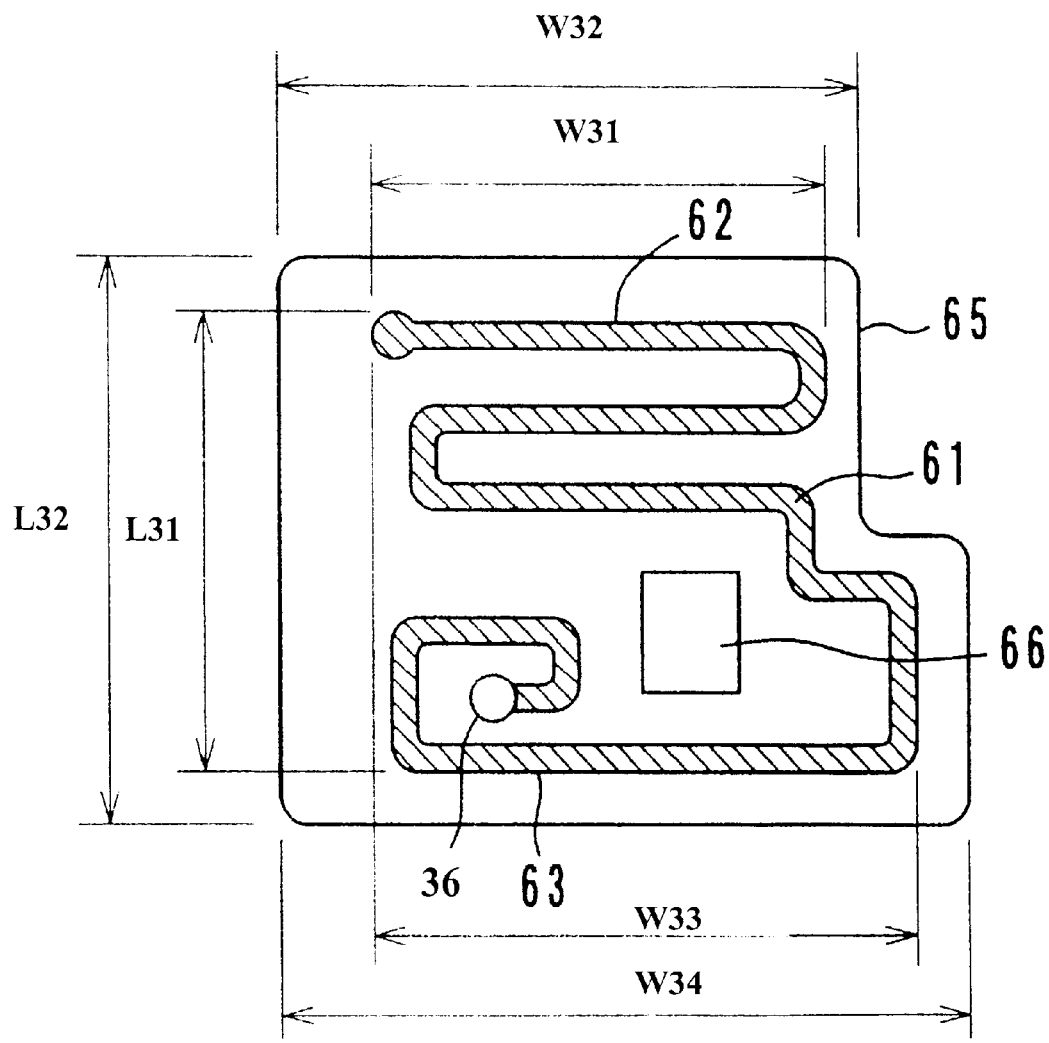
FIG. 7 is an illustration of another preferred embodiment of the present invention.

For example, an inductor electrode pattern 61 and a capacitor electrode pattern 65 as shown in FIG. 7 can also be used. The inductor electrode pattern 61 preferably has a serpentine pattern portion 62 and a spiral pattern portion 63. The capacitor electrode pattern 65 preferably has a substantially rectangular shape which corresponds to the outer shape of the inductor electrode pattern 61. The projection of the inductor electrode pattern 61 onto the capacitor electrode pattern 65 is included within the capacitor electrode pattern 65.

More particularly, upper and lower outer lateral lengths W31 and W33 and an outer longitudinal length L31 of the inductor electrode pattern 61 and upper and lower lateral lengths W32 and W34 and an outer longitudinal length L32 of the capacitor electrode pattern 65 preferably satisfy the following conditions, respectively, as these reference marks are shown in FIG. 7:

$W32=W31+\Delta$, where 0.1 mm$\leq\Delta\leq$1.0 mm, $W34=W33+\Delta$, where 0.1 mm$\leq\Delta\leq$1.0 mm, and $L32=L31+\Delta$, where 0.1 mm$\leq\Delta\leq$1.0 mm.

Furthermore, the inductor electrode pattern 61 is preferably located between regions of a distance ranging from about 0.05 mm to about 0.5 mm from the outer periphery of the capacitor electrode pattern 65.

In addition, the capacitor electrode pattern 65 has an opening (a hole) 66 in the region which does not face the inductor electrode pattern 61. Since the opening 66 is provided, the opposing area of a capacitor formed by the capacitor electrode pattern 65 is reduced, and accordingly the capacitance of the capacitor is reduced.

Moreover, the present invention is applicable to a band-pass filter, a high-pass filter, and a band elimination filter. The high frequency circuit component according to preferred embodiments of the present invention can be also applicable to a component of high frequency complex components such as an RF module.

Although a single component has been described in the foregoing preferred embodiments by way of example, a mother board having a plurality of high frequency circuit components can be fabricated and cut out in a desired size so as to provide a plurality of products for mass-production. Furthermore, although the insulating sheets having conductive patterns formed thereon are laminated and then integrally fired in the foregoing preferred embodiments, the present invention is not limited to the sheets described above and is applicable to sheets which are fired beforehand.

Also, a high frequency circuit component may be fabricated by a method which will be described below. A plain mother substrate has an insulating layer formed on the surface thereof by applying a paste-like insulating material by printing or other suitable process, then a predetermined conductive pattern formed by applying a paste-like conductive material on the foregoing insulating layer, and subsequently another insulating layer formed by applying a paste-like insulating material. By repeating these applying processes, the high frequency circuit component having a laminated structure can be obtained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A high frequency circuit component comprising:
   a laminate member including:
      at least one pair of capacitor electrode patterns for defining a capacitor;
      at least one inductor electrode pattern for defining an inductor; and
      at least one pair of insulating layers disposed between the at least one pair of capacitor electrode patterns and the at least one inductor electrode pattern; wherein
         the at least the capacitor electrode patterns, the inductor electrode pattern, and the insulating layers are laminated in a lamination direction to define the laminate member, and when viewed from the lamination direction of the laminate member, the projection of the inductor electrode pattern onto the capacitor electrode patterns is included within the capacitor electrode patterns, the distances between the capacitor electrode patterns and the inductor electrode pattern range from about 0.025 mm to about 1 mm, and an outer length A of the capacitor electrode patterns and a corresponding outer length B of the inductor electrode pattern satisfy the following condition I:

$A=B+\Delta$, where 0.1 mm$\leq\Delta\leq$1.0 mm    (I).

2. The high frequency circuit component according to claim 1, wherein the at least one inductor electrode pattern includes a first lead electrode pattern so as to connect to an external electrode disposed on the surface of the laminate member, and one of the at least one pair of capacitor electrode patterns includes a second lead electrode pattern so as to connect to the external electrode, and wherein, when viewed from the lamination direction of the laminate member, the projection of the first lead electrode pattern onto the second lead electrode pattern is included within the second lead electrode pattern.

3. The high frequency circuit component according to claim 2, wherein a line width D1 of the first lead electrode pattern and a line width D2 of the second lead electrode pattern satisfy the following condition II:

$$D2=D1+\Delta, \text{ where } 0.1 \text{ mm} \leq \Delta \leq 1.0 \text{ mm} \quad \text{(II)}.$$

4. The high frequency circuit component according to claim 1, wherein at least one of the at least one pair of capacitor electrode patterns has an opening formed therein.

5. The high frequency circuit component according to claim 4, wherein the hole formed in the at least one of the at least one pair of capacitor electrode patterns does not face the at least on inductor electrode pattern.

6. The high frequency circuit component according to claim 1, wherein the at least one inductor electrode pattern has at least one of a spiral shape and a serpentine shape.

7. The high frequency circuit component according to claim 1, wherein the at least one pair capacitor electrode patterns and the at least one inductor electrode pattern define an LC resonator.

8. The high frequency circuit component according to claim 1, wherein the at least one inductor electrode has a spiral shape, a first end that extends to an edge of the laminate member and a second end that is located within the spiral shape of the inductor electrode.

9. The high frequency circuit component according to claim 1, further comprising a lead electrode, wherein outer lateral and longitudinal lengths W11 and L11 of the at least one inductor electrode pattern, and the line width D1 of the lead electrode and outer lateral and longitudinal lengths W12 and L12 of at least one of the at least one pair of capacitor electrode patterns, and the line width D2 of the lead electrode satisfy the following conditions, respectively:

$$W12=W11+\Delta, \text{ where } 0.1 \text{ mm} \leq \Delta \leq 1.0 \text{ mm}$$

$$L12=L11+\Delta, \text{ where } 0.1 \text{ mm} \leq \Delta \leq 1.0 \text{ mm, and}$$

$$D2=D1+\Delta, \text{ where } 0.1 \text{ mm} \leq \Delta \leq 1.0 \text{ mm}.$$

10. The high frequency circuit component according to claim 1, wherein the at least one inductor electrode pattern is positioned between left and right edge regions W1*a* and between upper and lower edge regions L1*a* of one of the at least one pair of capacitor electrode patterns, wherein W1*a* and L1*a* preferably range from about 0.05 mm to about 0.5 mm.

11. The high frequency circuit component according to claim 1, wherein thicknesses of the at least one pair of insulating sheets is from about 0.025 mm to about 0.15 mm.

12. The high frequency circuit component according to claim 1, wherein the thickness of the insulating sheet between the at least one inductor electrode pattern and the capacitor electrode patterns is within the range from about 0.025 to about 1 mm.

13. The high frequency circuit component according to claim 1, wherein the high frequency circuit component defines a high frequency low-pass filter.

14. The high frequency circuit component according to claim 1, wherein the at least one inductor electrode pattern includes a serpentine pattern portion and a spiral pattern portion.

15. The high frequency circuit component according to claim 1, wherein each of the at least one pair of capacitor electrode patterns has a substantially rectangular shape which corresponds to an outer shape of the at least one inductor electrode pattern.

16. The high frequency circuit component according to claim 1, wherein upper and lower outer lateral lengths W31 and W33 and an outer longitudinal length L31 of the at least one inductor electrode pattern and upper and lower lateral lengths W32 and W34 and an outer longitudinal length L32 of each of the at least one pair of capacitor electrode patterns satisfy the following conditions:

$$W32=W31+\Delta, \text{ where } 0.1 \text{ mm} \leq \Delta \leq 1.0 \text{ mm},$$

$$W34=W33+\Delta, \text{ where } 0.1 \text{ mm} \leq \Delta \leq 1.0 \text{ mm, and}$$

$$L32=L31+\Delta, \text{ where } 0.1 \text{ mm} \leq \Delta \leq 1.0 \text{ mm}.$$

17. The high frequency circuit component according to claim 1, wherein the at least one inductor electrode pattern is located between regions of a distance ranging from about 0.05 mm to about 0.5 mm from an outer periphery of at least one of the at least one pair of capacitor electrode patterns.

18. The high frequency circuit component according to claim 1, wherein the high frequency circuit component is one of a band-pass filter, a high-pass filter, and a band elimination filter.

\* \* \* \* \*